United States Patent
Ootani

(10) Patent No.: US 7,589,975 B2
(45) Date of Patent: Sep. 15, 2009

(54) MOBILE INSTRUMENT WITH FLEXIBLE PRINTED WIRING BOARD

(75) Inventor: Takumi Ootani, Tokyo (JP)

(73) Assignee: NEC Corporation (JP)

( * ) Notice: Subject to any disclaimer, the term of this patent is extended or adjusted under 35 U.S.C. 154(b) by 353 days.

(21) Appl. No.: 11/197,337

(22) Filed: Aug. 5, 2005

(65) Prior Publication Data

US 2006/0050490 A1    Mar. 9, 2006

(30) Foreign Application Priority Data

Sep. 3, 2004    (JP)    ............................. 2004-256424

(51) Int. Cl.
    *H05K 1/00*    (2006.01)
(52) U.S. Cl. .................. 361/749; 361/348; 439/165
(58) Field of Classification Search ................. 361/736, 361/749, 1, 748; 455/575.1, 575; 174/254; 439/165

See application file for complete search history.

(56) References Cited

U.S. PATENT DOCUMENTS

| | | | |
|---|---|---|---|
| 2,963,535 A | | 12/1960 | Wegener et al. |
| 5,262,590 A | | 11/1993 | Lia |
| 5,317,292 A | | 5/1994 | Leeb |
| 5,541,813 A | * | 7/1996 | Satoh et al. ............... 361/752 |
| 5,795,299 A | | 8/1998 | Eaton et al. |
| 5,978,210 A | * | 11/1999 | McCrary .................... 361/680 |
| 5,995,373 A | * | 11/1999 | Nagai .......................... 361/755 |
| 6,255,582 B1 | | 7/2001 | Miller et al. |
| 6,568,947 B2 | * | 5/2003 | Koch-Osborne ............ 439/165 |
| 6,700,784 B2 | * | 3/2004 | Huang et al. ................ 361/715 |
| 6,959,210 B2 | * | 10/2005 | Nakamura ............... 455/575.3 |
| 7,001,193 B2 | * | 2/2006 | Zaderej et al. .............. 439/165 |
| 2002/0135993 A1 | | 9/2002 | Ueyama et al. |
| 2002/0187803 A1 | * | 12/2002 | Nakamura et al. ........... 455/550 |
| 2004/0048633 A1 | * | 3/2004 | Sato et al. ................. 455/556.1 |

FOREIGN PATENT DOCUMENTS

| | | |
|---|---|---|
| EP | 1 217 699 A1 | 6/2002 |
| JP | 2002-171047 | 6/2002 |
| JP | 2003-110210 | 4/2003 |
| JP | 2004-104528 | 4/2004 |

* cited by examiner

*Primary Examiner*—Tuan T Dinh
*Assistant Examiner*—Abiy Getachew
(74) *Attorney, Agent, or Firm*—Dickstein, Shapiro, LLP.

(57) ABSTRACT

A flexible connection substrate includes a first flexible substrate and a second flexible substrate. The first flexible substrate electrically connects first signal lines that are formed on a first circuit substrate to second signal lines that are formed on a second circuit substrate. The second flexible substrate is a flexible substrate for grounding, has a planar shape that is substantially the same as the first flexible substrate, and contains a conductive material throughout. The second flexible substrate connects to any of a plurality of grounding points that are formed on the first circuit substrate and any of a plurality of grounding points that are formed on the second circuit substrate. The first flexible substrate and the second flexible substrate are bonded to each other on one surface.

11 Claims, 10 Drawing Sheets

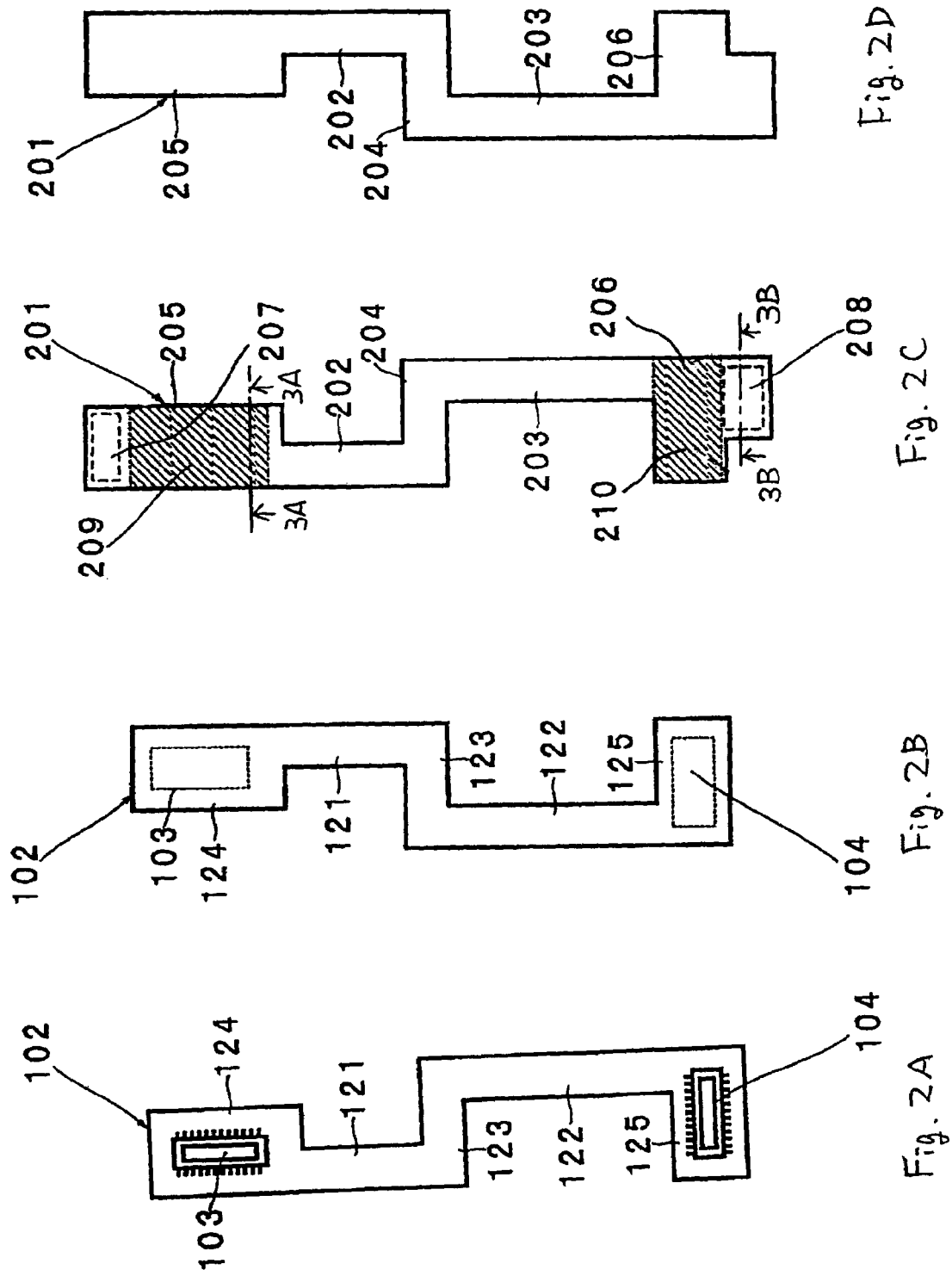

MOBILE INSTRUMENT WITH FLEXIBLE PRINTED WIRING BOARD

BACKGROUND OF THE INVENTION

1. Field of the Invention

The present invention relates to a flexible connection substrate and a folding electronic apparatus, and more particularly to a flexible connection substrate that is ideally used in a folding portable terminal such as a folding portable telephone, and to a folding electronic apparatus that uses this flexible connection substrate.

2. Description of the Related Art

In recent years, portable telephones have come into wide use, and among these devices, folding portable telephones in particular are in wide use. A folding portable telephone includes an upper case and a lower case that are freely rotatably linked together by a hinge. The upper case has a display unit, a speaker for producing sound from the receiver and from received sound, and a first circuit substrate for these components. The lower case has an operation part that includes a plurality of keys for input, a microphone for collecting transmission sound, and a second circuit substrate for these components. The first circuit substrate and the second circuit substrate are connected to each other by a flexible connection substrate. During use, a folding portable telephone is placed in an opened state in which the upper case and the lower case are opened to a prescribed angle with the hinge as the fulcrum, and when not in use, is placed in a closed state (folded state) in which the two cases are placed in substantially close contact with each other.

The flexible connection substrate includes, for example: a belt-like flexible base material; printed wiring patterns such as signal lines and a ground pattern (GND signal lines) that are formed on the base material; and connector terminals that are provided at the two ends of the base material. The connector terminals are connected to the first circuit substrate and the second circuit substrate, respectively. In this way, the same signals are transmitted to the first circuit substrate and the second circuit substrate by way of the flexible connection substrate. At this time, any voltage difference that occurs between the GND voltage of the first circuit substrate and the GND voltage of the second circuit substrate is not desirable from the standpoint of the electrical design, and the width and length of the ground pattern that is formed on the flexible connection substrate are therefore designed such that a difference in voltage does not occur. However, considerations relating to the folding construction and to more compact construction have limited the width and length of the ground pattern in a folding portable telephone, raising problems of reliability regarding the secure connection of the circuit substrates.

Japanese Patent Laid-Open Publication No. 2003-110210 discloses a flexible connection substrate in which ground patterns are formed on a first and second connection ends and a connection is realized between these ground patterns by jumper wires that are independent of the printed wiring pattern of the printed wiring board. By means of this configuration, the ground patterns of the printed wiring pattern are connected by means of the jumper wires, whereby the difference in ground voltage between the circuit substrates can be set to a desired value.

In this configuration, the jumper wires are routed through the hinge. There are now folding portable telephones having a variety of hinge constructions, including folding portable telephones in which the routing of jumper wires inside the hinge is extremely problematic. In addition, connection by jumper wires is not preferable from the standpoint of manufacture due to limitations in connection methods, such as soldering.

Japanese Patent Laid-Open Publication No. 2004-104528 discloses a radio device in which wiring (signal lines) other than ground lines of a first circuit substrate and a second circuit substrate are mutually connected by a first flexible connection substrate, and the ground lines of each of the first circuit substrate and second circuit substrate are connected by a second flexible connection substrate. However, the first and second flexible connection substrates are constructions that are completely independent of each other, and this publication discloses nothing more than the independent connection of signal lines and ground lines. In this radio device, moreover, no consideration is given to a construction for routing a flexible connection substrate in the hinge so as not to interfere with the operation of two cases that are linked together by a hinge. Further, the radio device gives no consideration to shielding the noise that is generated from the first flexible connection substrate for connecting signal lines.

SUMMARY OF THE INVENTION

The present invention has as an object a flexible connection substrate that is used for connecting each of the circuit substrates inside two cases in a folding electronic apparatus that allows routing through the hinge regardless of the construction of the hinge, and moreover, that eliminates the need for soldering such as for jumper lines.

It is another object of the present invention to provide a flexible connection substrate and folding electronic apparatus that enable a reduction of the difference in ground voltage between two circuit substrates.

It yet another object of the present invention to provide a flexible connection substrate having a construction that has the effect of shielding noise that is generated by the first flexible substrate.

A flexible connection substrate of the present invention for achieving the above-described objects is a flexible connection substrate of a folding electronic apparatus that includes: a first case for accommodating a first circuit substrate in its interior; a second case for accommodating a second circuit substrate in its interior; and a hinge for realizing freely rotatable linking of the first case and the second case; the flexible connection substrate electrically connecting the first circuit substrate and the second circuit substrate through the interior of the hinge. The flexible connection substrate of the present invention includes: a first flexible substrate for electrically connecting first signal lines that are formed on the first circuit substrate to second signal lines that are formed on the second circuit substrate; and a second flexible substrate that is a second flexible substrate for grounding, that has substantially the same planar shape as the first flexible substrate, that includes a conductive material throughout its entirety, and that connects to any of a plurality of first grounding points that are formed on the first circuit substrate and to any of a plurality of second grounding points that are formed on the second circuit substrate. The first flexible substrate and the second flexible substrate are bonded together on one surface.

In this invention, a second flexible substrate on which only GND is formed is used, separately from the first flexible substrate that connects the first circuit substrate and the second circuit substrate, to connect to the GND of each of the first circuit substrate and the second circuit substrate, and jumper wires are not used. As a result, the difference in ground voltage between the first circuit substrate and the second circuit substrate can be decreased.

In addition, in the flexible connection substrate of the present invention for achieving the above-described objects, the first flexible substrate has on the two ends of its front surface a first connector that is connected to an upper substrate connector and a second connector that is connected to a lower substrate connector; and the front surface or rear surface of the second flexible substrate is bonded by conductive tape to the vicinities of the two ends on the rear-surface side of the first flexible substrate.

In the present invention, bonding is not realized by conductive tape in the above-described hinge area, and a configuration is therefore possible in which the flexible connection substrate does not affect the opening and closing operation of the upper case and lower case.

In the above-described invention, the first flexible substrate may include a first connector that is connected to a connector of the first circuit substrate and a second connector that is connected to a connector of the second circuit substrate; and the front surface or rear surface of the second flexible substrate may be bonded by conductive tape to the vicinities of the two ends of the rear-surface side of the first flexible substrate.

By not bonding by conductive tape in the vicinity of the hinge, a flexible connection substrate can be realized that does not affect the opening and closing operation of the first case and second case.

Alternatively, the first flexible substrate may have on the two ends of its front surface a first connector that is connected to a connector of the first circuit substrate and a second connector that is connected to a connector of the second circuit substrate; and the second flexible substrate may have openings in which the conductive material is exposed that is bonded to the first and second grounding points at positions in the vicinities of the first and second connectors, respectively.

Alternatively, the first flexible substrate may have at the two ends of its front surface a first connector that is connected to a connector of the first circuit substrate and a second connector that is connected to a connector of the second circuit substrate; and the second flexible substrate may have metal terminals that are connected to the conductive material and that are soldered to first and second grounding points at positions in the vicinities of the first and second connectors, respectively. Although this type of configuration involves more work time than a case in which bonding is realized by conductive double-faced tape, this configuration results in lower impedance than a case of using conductive double-faced tape and, from the electrical standpoint, is therefore more suitable for grounding.

Alternatively, the first flexible substrate may have on the two ends of its front surface a first connector that is connected to the connector of the first circuit substrate and a second connector that is connected to the connector of the second circuit substrate; and the second flexible substrate may have openings in which the conductive material is exposed that is connected by Anisotropic Conductive Film (ACF) to the first and second grounding points at positions in the vicinities of the first and second connectors, respectively. This configuration enables a thin construction and is therefore suited to high-density packaging.

Alternatively, the first flexible substrate may have on the two ends of its front surface a first connector that is connected to the connector of the first circuit substrate and a second connector that is connected to the connector of the second circuit substrate; the second flexible substrate may include first and second openings in which the conductive material is exposed at positions in the vicinities of the first and second connectors, respectively; and predetermined grounding points of a plurality of first grounding points may be connected to the first opening and predetermined grounding points of a plurality of second grounding points may be connected to the second opening by clips having conductivity. This configuration can both prevent dislodgement of connectors and establish ground connection.

Alternatively, the second flexible substrate may have a structure in which a conductive layer that uses copper foil as the conductive material and a coverlay are sequentially layered on a base film; and in which openings are provided in the coverlay to expose the conductive layer at points that are to be connected to any of a plurality of first grounding points and points that are to be connected to any of a plurality of second grounding points.

Further, as previously described, the flexible connection substrate of the present invention is a flexible connection substrate for electrically connecting a first circuit substrate and a second circuit substrate of a folding electronic apparatus through the inside of a hinge, and includes a first flexible substrate and a second flexible substrate that are configured to sandwich the first flexible substrate. The first flexible substrate is provided on the two ends of its front surface with a first connector that is connected to the first circuit substrate and a second connector that is connected to the second circuit substrate; and electrically connects first signal lines that are formed on the first circuit substrate with second signal lines that are formed on the second circuit substrate. The second flexible substrate includes a first substrate part that has substantially the same planar shape as the first flexible substrate and that contains a conductive material throughout and a second substrate part that has a planar shape that has line symmetry with the first substrate part with the folding portion as the axis of symmetry with respect to the first substrate part and that contains a conductive material throughout; whereby folding at the folding portion causes the first substrate part to confront the second substrate part. The first substrate part has: a first connection part that is connected to any of the plurality of first grounding points that is formed on the first circuit substrate; a second connection part that is connected to any of the plurality of second grounding points that is formed on the second circuit substrate; a first connector passage hole of a size that allows passage of the first connector; and a second connector passage hole of a size that allows passage of the second connector. After folding at the folding portion such that the first substrate part and second substrate part confront each other and the first and second connectors have passed through the first and second connector passage holes, respectively, the first flexible substrate is interposed between the first substrate part and the second substrate part.

In this configuration, the two surfaces of the first flexible substrate can be covered by the second flexible substrate, whereby the first flexible substrate can be completely enclosed by the GND of the second flexible substrate.

In the above-described construction, the first and second substrate parts of the second flexible substrate may have a construction in which a conductive layer that uses copper foil as a conductive material and a coverlay are successively layered on a base film, and openings may be provided in the coverlay at a first connection part and a second connection part such that the conductive layer is exposed.

The folding electronic apparatus of the present invention uses the above-described flexible connection substrate according to the present invention.

According to the present invention, jumper wires are not required, and there is consequently no need to secure space for using jumper wires. Thus, in a folding electronic apparatus, the first circuit substrate and the second circuit substrate can be connected through the inside of the hinge regardless of the type of hinge structure. Moreover, GND of the first circuit substrate and GND of the second circuit substrate are connected by a second flexible substrate that is separate from the first flexible substrate that connects the various signal lines between each of the circuit substrates, and the difference in ground voltage between the first circuit substrate and the second circuit substrate can therefore be decreased. Further, the degree of freedom for positioning points for grounding can be raised (grounding is possible at a plurality of points) and connection can be realized regardless of the type of hinge structure.

In addition, the adoption of a construction in which the two surfaces of the first flexible substrate are interposed between the second flexible substrate can realize the effect of simultaneously reducing the difference in ground voltage between each of the circuit substrates due to the second flexible substrate and also shielding the noise that is generated from the first flexible substrate.

The above and other objects, features, and advantages of the present invention will become apparent from the following description with reference to the accompanying drawings, which illustrate examples of the present invention.

BRIEF DESCRIPTION OF THE DRAWINGS

FIG. 2A is a plan view of the first flexible substrate of the flexible connection substrate shown from FIG. 1 as seen from the front surface;

FIG. 2B is a plan view of the first flexible substrate of the flexible connection substrate shown in FIG. 1 as seen from the rear surface;

FIG. 2C is a plan view of the second flexible substrate of the flexible connection substrate shown in FIG. 1 as seen from the front surface;

FIG. 2D is a plan view of the second flexible substrate of the flexible connection substrate shown in FIG. 1 as seen from the rear surface;

DETAILED DESCRIPTION OF THE PREFERRED EMBODIMENTS

Figure 1:
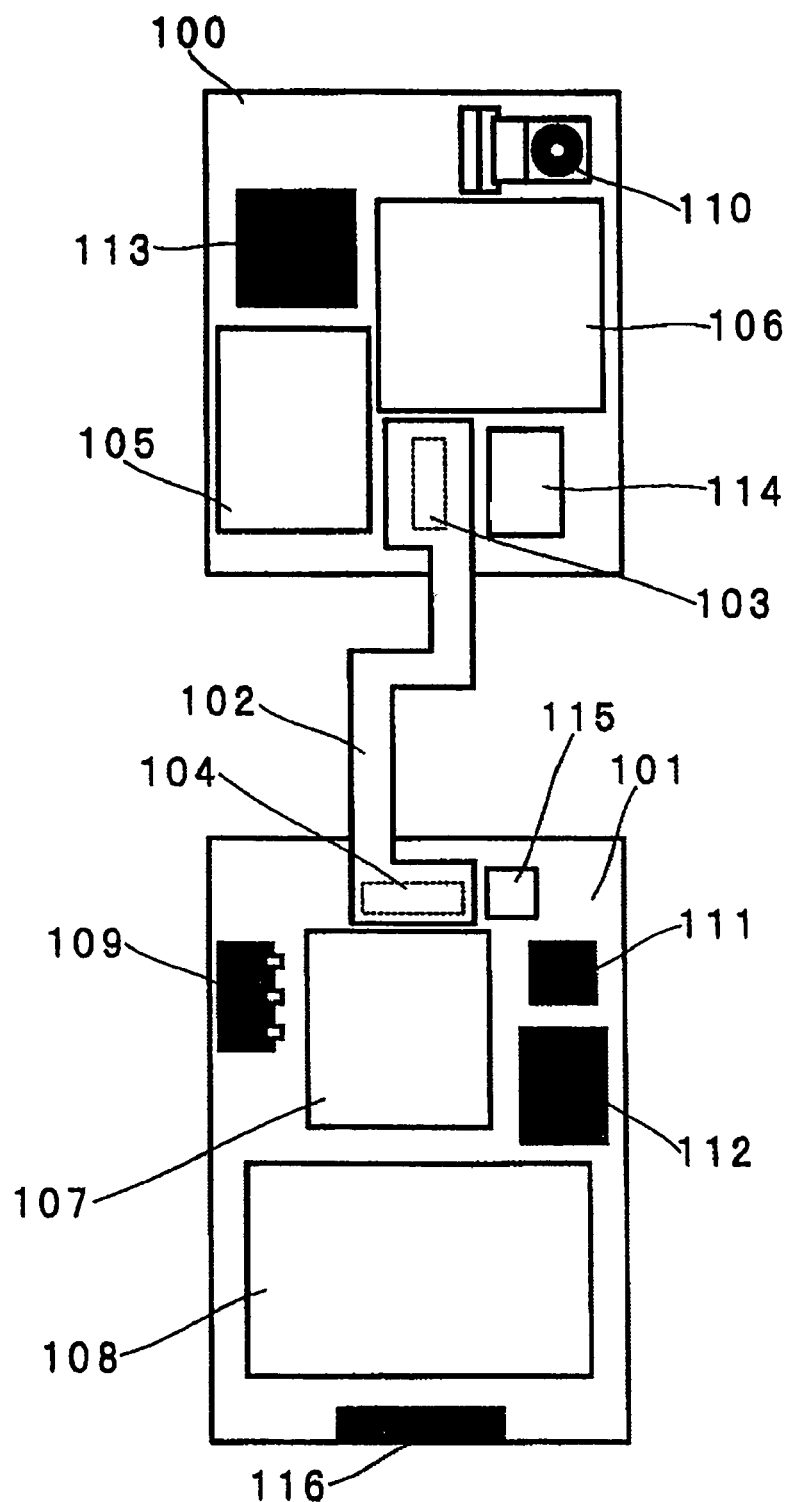
FIG. 1 shows the principal parts of the flexible connection substrate according to the first embodiment of the present invention together with the upper substrate and the lower substrate of a folding electronic apparatus.

Referring now to FIG. 1, a flexible connection substrate according to the first embodiment of the present invention is shown that includes first flexible substrate 102 that connects upper circuit substrate 100 and lower circuit substrate 101.

Figure 10:
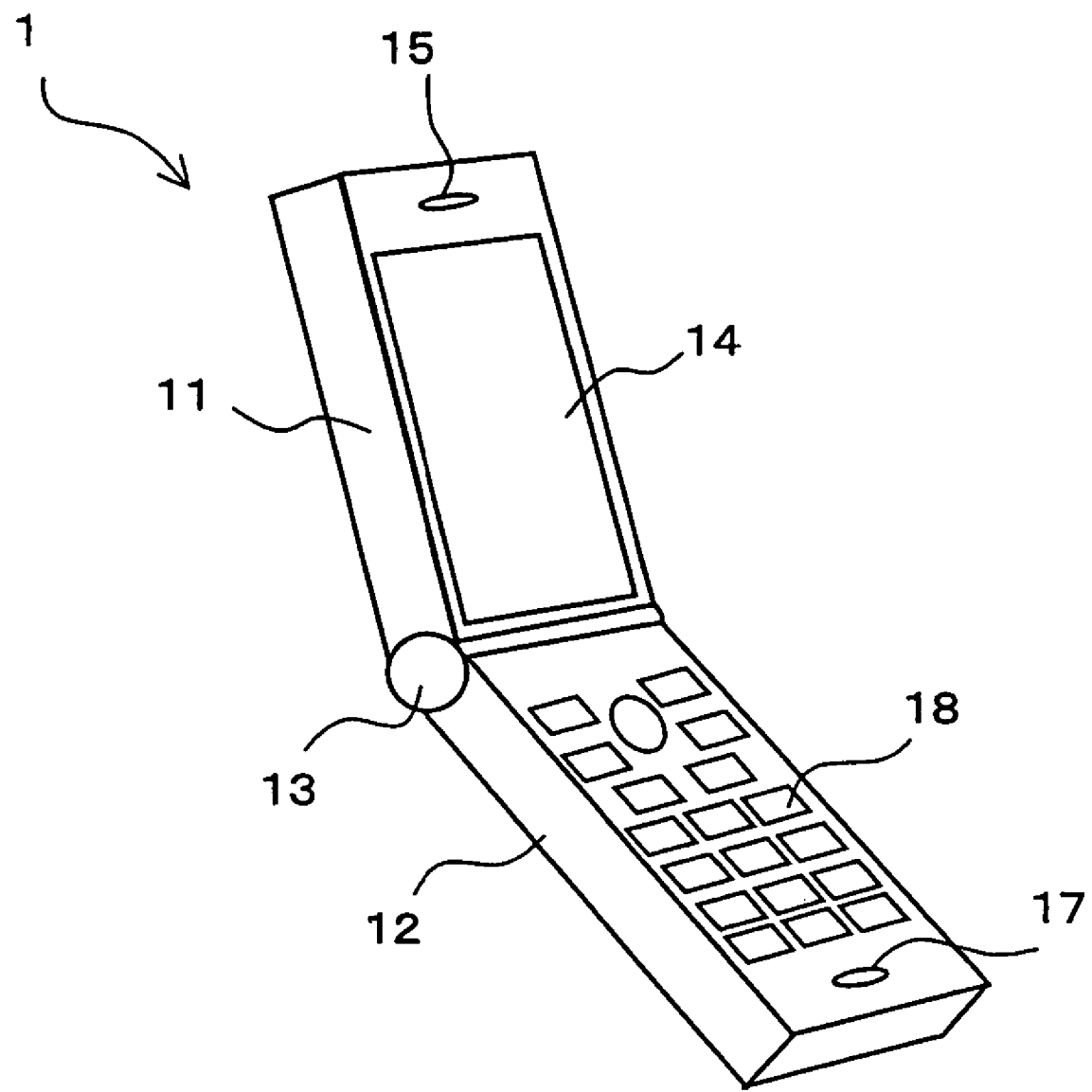
FIG. 10 is a perspective view of a folding portable telephone that incorporates the flexible connection substrate of the present invention.

This flexible connection substrate is used in folding portable telephone 1 that is shown in FIG. 10. Folding portable telephone 1 includes upper case 11 and lower case 12 that are freely rotatably linked by hinge 13. Upper case 11 includes: display unit 14, speaker 15 for generating receiver sound and received sound; and upper circuit substrate 100 shown in FIG. 1 for these components. Lower case 12 includes: an operation unit that includes a plurality of keys 18 for input, a microphone 17 for collecting transmission sound, and lower circuit substrate 101 shown in FIG. 1 for these components. Upper circuit substrate 100 and lower circuit substrate 101 are interconnected by a flexible substrate. During use, folding portable telephone 1 is placed in an open state in which upper case 11 and lower case 12 are opened to a prescribed angle with hinge 13 as a fulcrum, and when not in use, is placed in a closed state in which upper case 11 and lower case 12 confront each other in substantially close contact (folded state).

Upper circuit substrate 100 that is shown in FIG. 1 is arranged inside upper case 11. Lower circuit substrate 101 is arranged inside lower case 12. First flexible substrate 102 connects signal lines of upper circuit substrate 100 with signal lines of lower circuit substrate 101.

In upper circuit substrate 100, components such as a connector that is connected to connector 103 of first flexible substrate 102, an interface (I/F) of the display system module, image processing integrated circuit (IC) 113 for operating the display system, metal shields 105 and 106 as a countermeasure for noise that is generated from IC 113 and for reinforcement of the soldering strength of IC 113, and memory are mounted. The display system module includes components such as a liquid crystal display element (LCD) that makes up display unit 14 of the inside surface of upper case 11 and the backlight of the liquid crystal display element, an LCD that is provided on the outside surface (back surface) of upper case 11, and camera module 110.

In lower case substrate 101, components such as a connector that is connected to connector 104 of first flexible substrate 102, other connectors 109 and 116, radio IC 111, baseband IC 112, antenna, metal shields 107 and 108 as a countermeasure to noise that is generated from connector 109 and the various ICs 111 and 112 and for reinforcement of the soldering of ICs, and GND pad 115 are mounted. In the interior of metal shields 107 or 108, central processing unit (CPU) is provided mounted on substrate 101. Radio IC 111 and baseband IC 112 may be provided inside metal shield 107 or 108. Metal shields 105, 106, 107, and 108 are grounded to GND of the substrate and soldering, and the surfaces of these metal shields 105, 106, 107, and 108 are therefore the GND voltage.

Upper circuit substrate 100 and first flexible substrate 102 are connected by a connector, and lower circuit substrate 101 and first flexible substrate 102 are connected by a connector. Normally, stacking connectors such as shown in FIG. 1 can be used as this type of connector.

The flexible connection substrate includes: first flexible substrate 102 that is provided with various signal lines for connecting the various parts that have been mounted on upper circuit substrate 100 and lower circuit substrate 101; and second flexible substrate 201 that has been prepared separately from first flexible substrate 101 and that is used for strengthening the grounding of upper circuit substrate 100 and lower circuit substrate 101 (for decreasing the difference in the voltage of GND).

The front surface of first flexible substrate 102 is shown in FIG. 2A, and its rear surface is shown in FIG. 1 and FIG. 2B. First flexible substrate 102 is formed in a crank shape in which first belt part 121 having first connection end 124 at its end and second belt part 122 having second connection end 125 at its end are unified by middle part 123. Connector 103 is further provided at first connection end 124, and connector 104 is provided at second connection end 125. Connectors 103 and 104 are electrically connected to printed wiring patterns that are formed on belt part 121, middle part 123, and belt part 122. As shown in FIG. 1, connector 103 that is provided on the front surface of first flexible substrate 102 connects to a connector that is provided on upper circuit substrate 100, and connector 104 that is provided on the front surface of first flexible substrate 102 connects to a connector that is provided on lower circuit substrate 101.

The front surface of second flexible substrate 201 is shown in FIG. 2C and its rear surface is shown in FIG. 2D. Second flexible substrate 201 is formed in a crank shape in which first belt part 202 having first connection end 205 at its end and second belt part 203 having second connection end 206 at its end are unified by middle part 204. Coverlay opening 207 is formed at the end of first connection end 205, and coverlay opening 208 is formed at the end of second connection end 206.

First belt part 121 of first flexible substrate 102 has approximately the same width and same length as first belt part 202 of second flexible substrate 201. Second belt part 122 of first flexible substrate 102 has approximately the same width and the same length as second belt part 203 of second flexible substrate 201. Middle parts 123 and 204 each have approximately the same width and same length. However, connection end 205 of second flexible substrate 201 is formed larger than connection end 124 of first flexible substrate 102. Connection end 206 of second flexible substrate 201 is also formed in a larger and different shape than connection end 125 of first flexible substrate 102. As shown by the diagonal hatching on the front surface of second flexible substrate 201, double-faced tape 209 is adhered to connection end 205 such that coverlay opening 207 is not covered, and double-faced tape 210 is also adhered to connection end 206 such that coverlay opening 208 is not covered.

Double-faced tape is not applied over the entire surface of second flexible substrate 201 because application of double-faced tape to belt parts 202 and 203 and middle part 204 that pass through the hinge of the folding portable telephone would hinder the bending of the flexible connection substrate when the upper case and lower case are opened and closed.

Figure 3A:
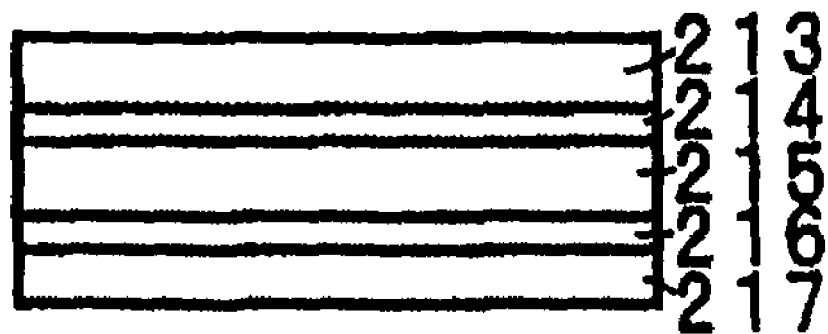
FIG. 3A is a sectional view taken along the 3A-3A line of FIG. 2C.
Figure 3B:
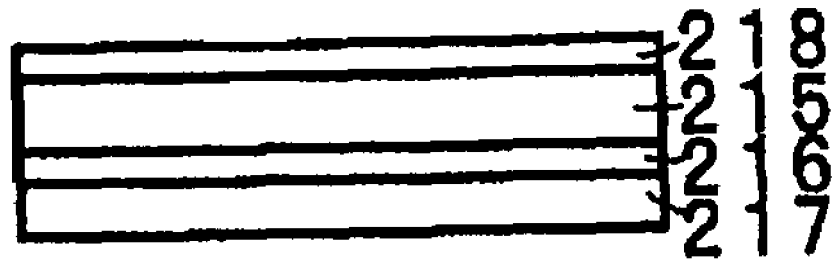
FIG. 3B is a sectional view taken along the 3B-3B line of FIG. 2C.

The following explanation regards the layer construction of second flexible substrate 201 with reference to FIG. 3A, which is a sectional view of first connection end 205, and FIG. 3B, which is a sectional view of second connection end 206. Double-faced tape 209 and 210 that are shown in FIG. 2C are omitted in FIG. 3A and FIG. 3B. Other than the portions of coverlay openings 207 and 208, the layer construction of second flexible substrate 201 is a configuration in which, as shown in FIG. 3A, copper foil layer 215 is bonded to base film 217 by means of adhesive 216, and coverlay 213 is bonded over copper foil layer 215 by means of adhesive 214. A polyimide and an epoxy resin that is a coating of the polyimide are normally used for coverlay 213.

As shown in FIG. 3B, the layer configuration of second flexible substrate 201 in portions in which coverlay openings 207 and 208 are formed includes base film 217 and copper foil layer 215 that is bonded on base film 217 by way of adhesive 216. Portions in which coverlay 213 is present do not conduct, and the grounding of GND of each circuit substrate 100 and 101 is realized at coverlay openings 207 and 208. Copper foil layer 215 is exposed at these coverlay openings 207 and 208, and copper foil layer 215 is plated with nickel (Ni) and gold (Au) to prevent corrosion of copper foil layer 215. In addition, the width of copper foil layer 215 at belt parts 202 and 203 and middle part 204 is made as thick as possible.

As can be clearly understood from FIG. 3A and FIG. 3B, second flexible substrate 201 as a whole has a layer configuration in which copper foil layer 215 is bonded to base film 217 by way of adhesive 216.

Figure 4:
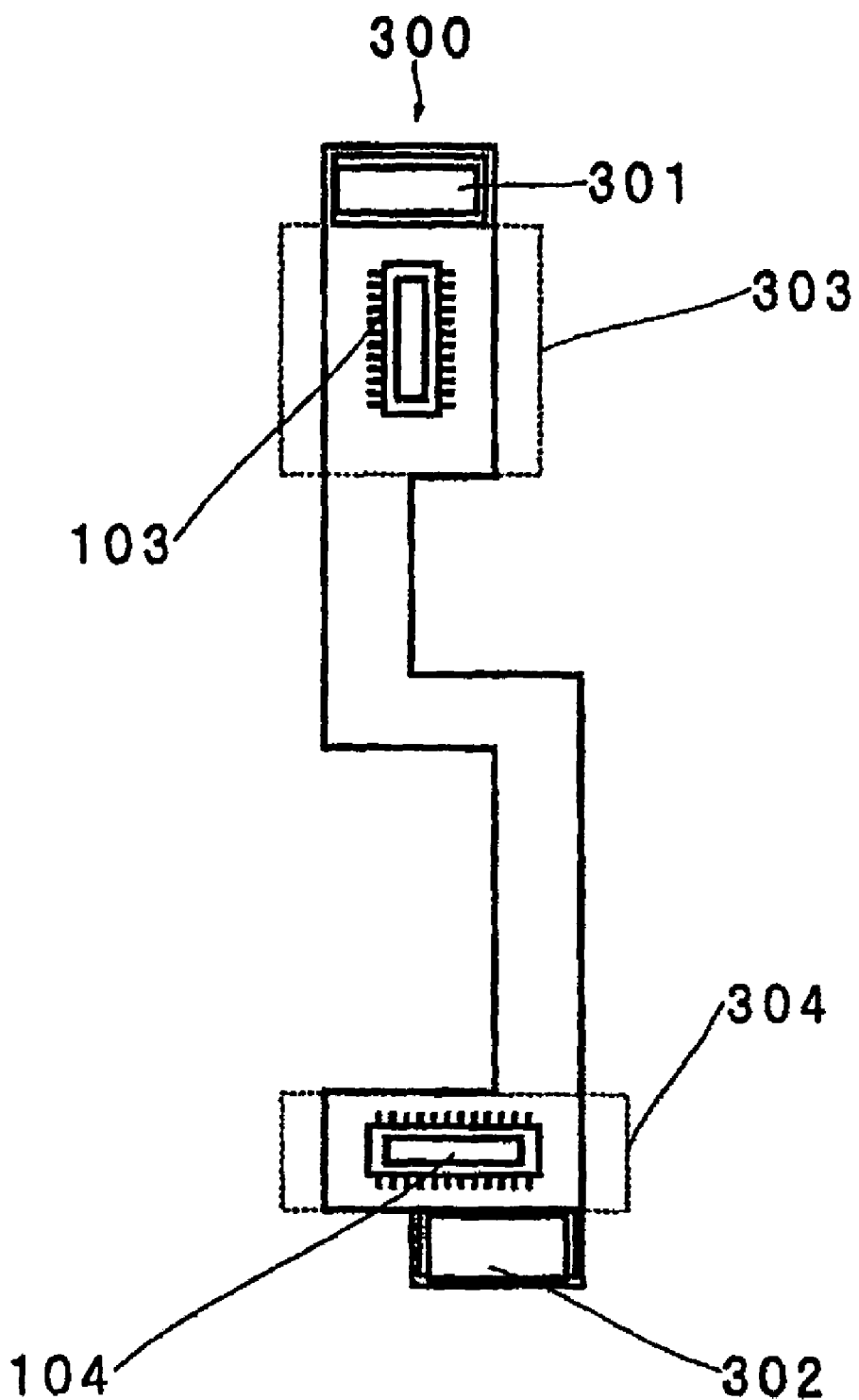
FIG. 4 is a plan view of the flexible connection substrate shown in FIG. 1.

Referring to FIG. 4, a plan view is shown of flexible connection substrate 300 in which the above-described first flexible substrate 102 and second flexible substrate 201 are adhered together. The rear surface of first flexible substrate 101 is stacked on the front surface of second flexible substrate 201, and the two substrates are adhered together by means of double-faced tape 209 and 210 that have been applied to the front surface of second flexible substrate 201 that was shown in FIG. 2C.

The connection between upper circuit substrate 100 and lower circuit substrate 101 according to the present embodiment can be realized as described below.

The rear-surface side of connection ends 124 and 125 on which connectors 103 and 104 are mounted in first flexible substrate 102 are stacked on the front surface of second flexible substrate 201 and bonded by means of double-faced tape 209 and 210. Rigid reinforcement plates such as stainless steel plates are normally mounted on connection ends 124 and 125 for mounting connectors 103 and 104, and firm mounting can therefore be realized. In FIG. 4, bonding regions 303 and 304 indicate the points of adhesion by the above-described double-faced tape 209 and 210. In addition, coverlay openings 301 and 302 indicate the openings in which the coverlay openings 207 and 208 of second flexible substrate 201 have actually been opened.

Finally, connection between upper circuit substrate 100 and lower circuit substrate 101 in FIG. 1 is realized by way of flexible connection substrate 300 using connectors 103 and 104. Coverlay openings 301 and 302 in FIG. 4 are then adhered to the ground portions of each of circuit substrates 100 and 101 using conductive tape. By adopting this configuration, GND of upper circuit substrate 100 and lower circuit substrate 101 can be connected together using flexible connection substrate 300.

Figure 5:
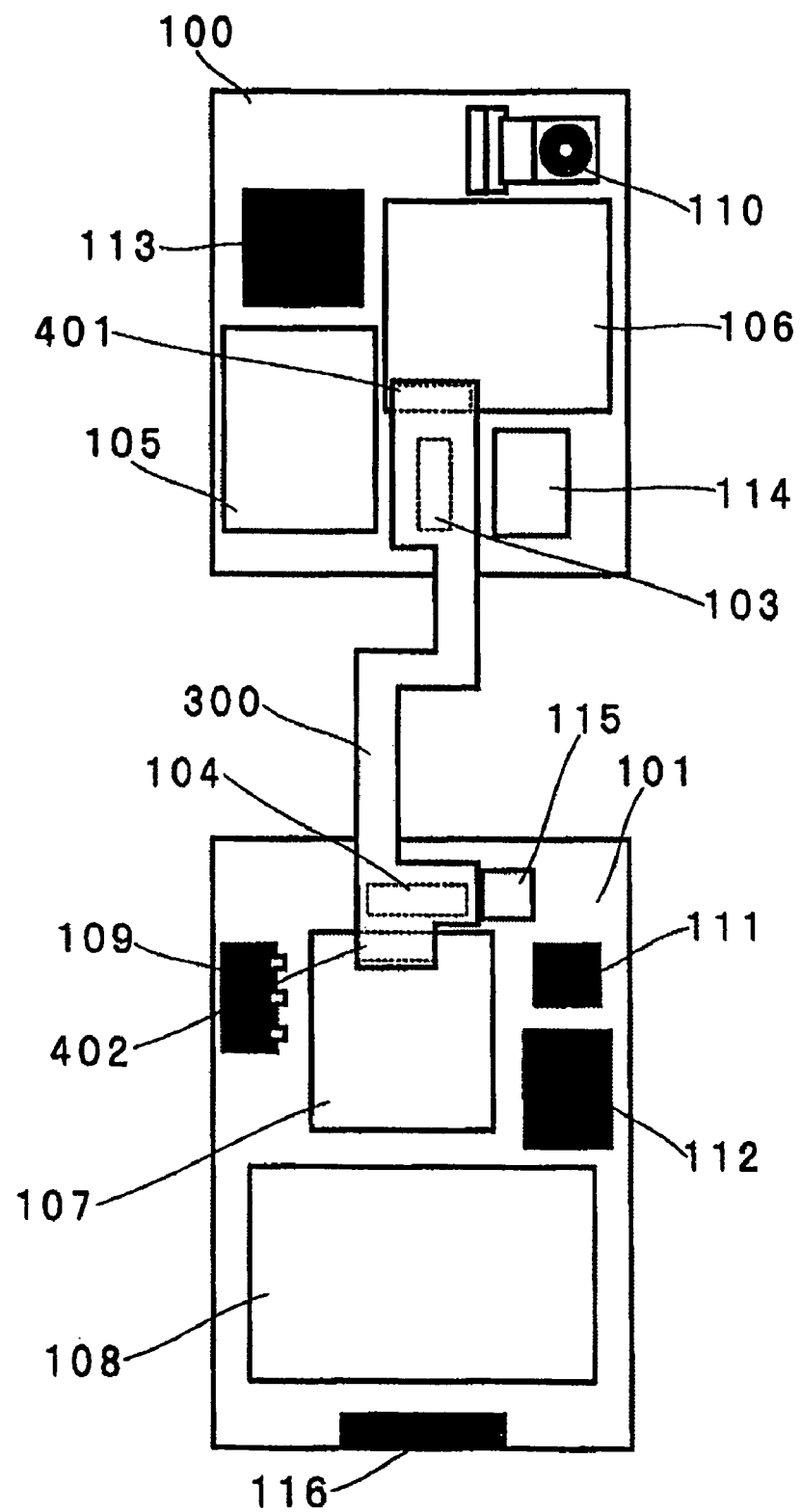
FIG. 5 shows the flexible connection substrate shown in FIG. 4 together with the upper substrate and the lower substrate of a folding portable telephone.

FIG. 5 shows an actual example. As shown in FIG. 5, one end of flexible connection substrate 300 is adhered to metal shield 106 on upper circuit substrate 100 by conductive tape with one coverlay opening as bonding region 401. The other end of flexible connection substrate 300 is adhered by conductive tape to metal shield 107 on lower circuit substrate 101 with the coverlay opening as bonding region 402. This use of conductive tape in the present embodiment enables an extremely simple connection between the GND of upper circuit substrate 100 and the GND of lower circuit substrate 101.

Thus, according to the present embodiment, flexible connection substrate 300 has a construction in which first flexible substrate 102 is adhered to second flexible substrate 201 that is separately prepared and that is used in the reinforcement of grounding between upper circuit substrate 100 and lower circuit substrate 101 (in order to decrease the GND voltage difference). This flexible connection substrate 300 features excellent flexibility. In addition, since jumper wires are not used for connection of GND, space for using jumper wires need not be reserved. Due to the above-described points, upper circuit substrate 100 and lower circuit substrate 101 can be connected through the inside of the hinge regardless of the hinge construction in the folding portable telephone.

In the present embodiment, a method has been described for ground reinforcement by bonding between flexible connection substrate 300 and metal shields 106 and 107 that are formed on circuit substrates 100 and 101. The following explanation regards methods of grounding by other methods involving the design of the shape and grounding area of the flexible connection substrate.

Three modifications are here described that differ from the form in which coverlay openings 301 and 302 in flexible connection substrate 300 are adhered to metal shields 106 and 107 of circuit substrates 100 and 101 by conductive double-faced tape as in the example that was explained in FIG. 5.

In the first modification, coverlay openings 301 and 302 that are shown in FIG. 4 are modified to metal terminals that can be soldered. In this modification, second flexible substrate 201 for ground reinforcement can be soldered to the GND of the circuit substrates. Because soldering work is included in the connection of the flexible connection substrate in this modification, more work time is required than in a bonding method that is realized by conductive double-faced tape as in the first embodiment. However, solder has lower impedance than conductive double-faced tape and is therefore better suited to grounding from an electrical standpoint.

In the second modification, copper foil exposure points (coverlay openings) of second flexible substrate 201 are grounded by means of connection to the circuit substrates using a known ACF (Anisotropic Conductive Film). In this method, the grounding area can be finished with a thinner structure than constructions that employ soldering or double-faced tape. As a result, surplus space is produced above the grounding areas, and this space is extremely useful in portable telephones, in which high-density packaging is demanded.

Figure 6:
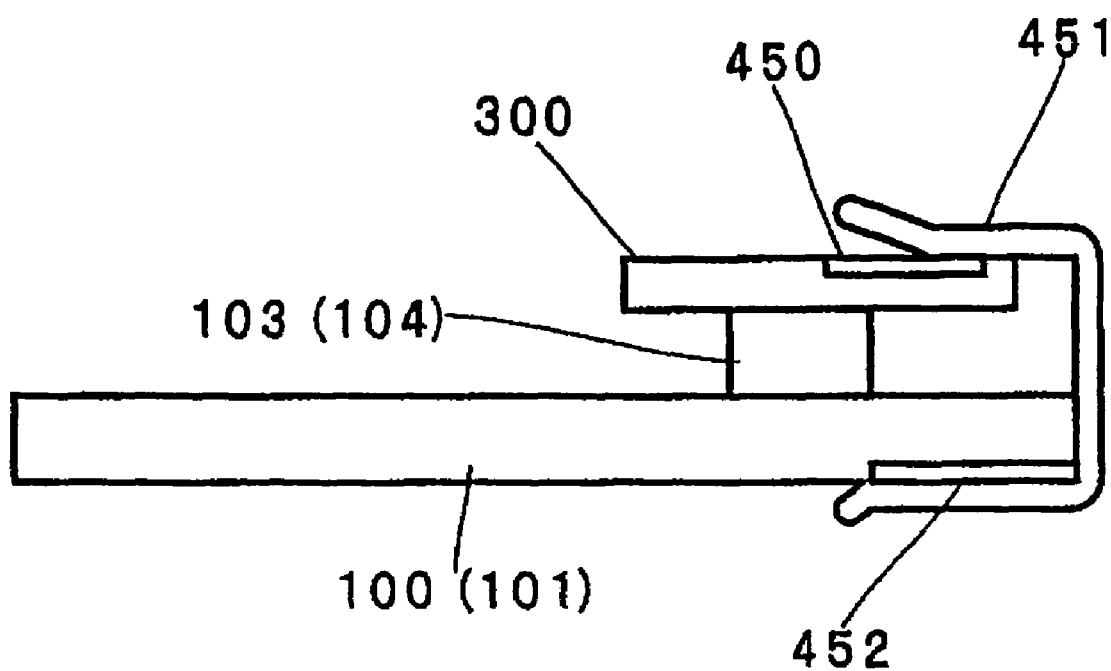
FIG. 6 is a side view showing an example of the method of grounding a flexible substrate that employs clips.

The third modification is a grounding method that employs conductive clips 451, as shown in FIG. 6. FIG. 6 shows a sectional view of a portion in which flexible connection substrate 300 and upper circuit substrate 100 (lower circuit substrate 101), which is a printed board, are connected by connector 103 (104). Flexible connection substrate 300 has coverlay openings 450 in which coverlay openings, which are copper foil exposure points, are arranged on the surface opposite that of FIG. 4 and FIG. 5. GND pads 452 are provided on circuit substrate 100 (101), and these GND pads 452 and coverlay openings 450 are clasped using, for example, conductive clips 451 that are made from metal, with flexible connection substrate 300 and printed board 100 (101) interposed. GND pads 452 are connected to flexible connection substrate 300 by way of clips 451. This method simultaneously enables GND connections and prevents dislodgement of connector 103 (104).

An example is next shown as the second embodiment of the present invention in which second flexible substrate 201 that was described in FIG. 2 is caused to function as a shield of first flexible substrate 102. In first flexible substrate 102, signal lines such as a data bus or clock lines to an LCD pass from lower circuit substrate 101. It is well known that, when these signal lines are in operation, radiation noise that bring about a suppression of radio sensitivity is generated from the front surface of first flexible substrate 102.

In the prior art, a silver paste or film is printed on first flexible substrate 102 to thus shield noise. A silver paste or film hardens first flexible substrate 102 and can lead to line breaks caused by the opening and closing of the folding portable telephone. This paste or film is connected with GND portions on first flexible substrate 102 to connect with the GND of the upper and lower circuit substrates. In most cases, however, GND connection parts that are provided on first flexible substrate 102 can connect only within an extremely narrow range due to the balance with signal lines. In the present embodiment, the second flexible substrate serves a function that is equivalent to this silver film or paste.

Figure 7:
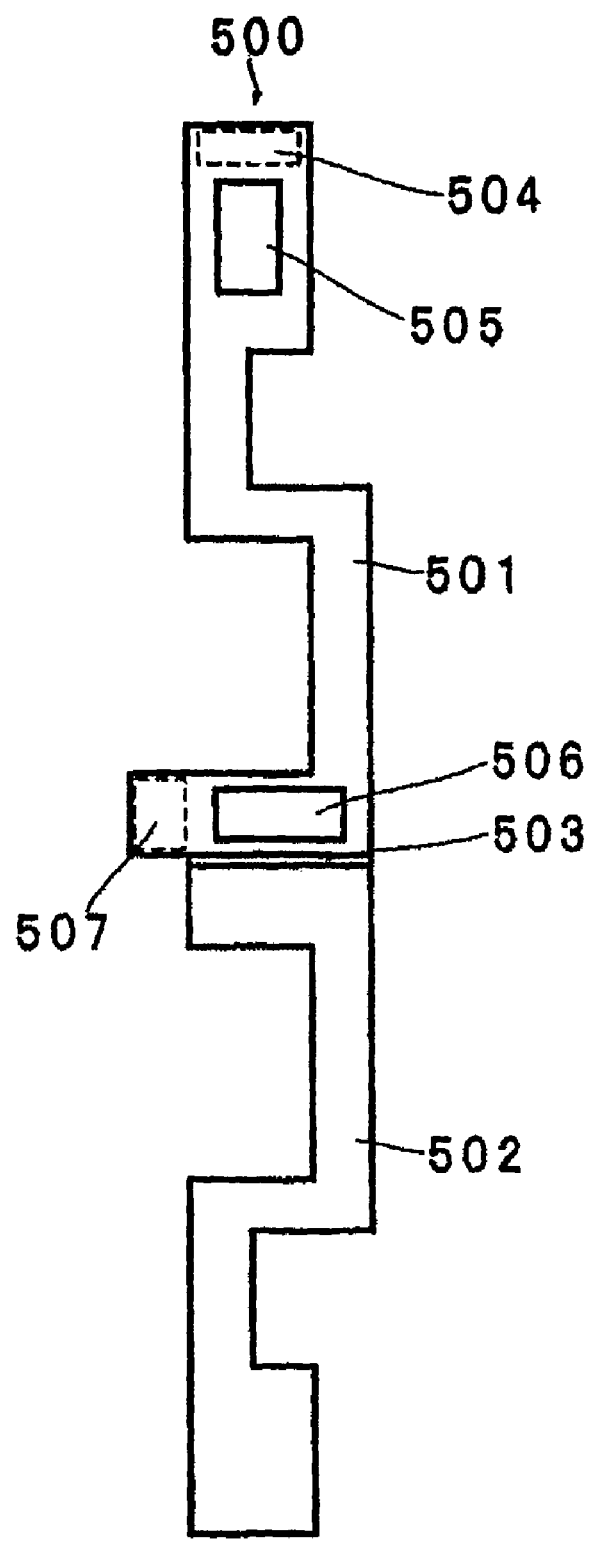
FIG. 7 is a development of the second flexible substrate according to the second embodiment of the present invention.

Referring to FIG. 7, a plan view of second flexible substrate 500 according to the second embodiment of the present invention is shown. Second flexible substrate 500 has the same layer configuration as second flexible substrate 201 that was used in the previously described embodiment, but has a modified outer shape. More specifically, second flexible substrate 500 of the present embodiment is composed of: first substrate part 501 having approximately the same planar outer shape as first flexible substrate 102 and second substrate part 502 that has a planar outer shape that has line symmetry with first substrate part 501 with the folding portion as the axis of symmetry with respect to this first substrate part 501.

Coverlay opening 504 is provided on one end part of first substrate part 501 at a position that corresponds to a prescribed grounding point of upper circuit substrate 100. Coverlay opening 507 is provided on the other end part of first substrate part 501 at a position that corresponds to a prescribed grounding point of lower circuit substrate 101. In addition, connector passage holes 505 and 506 of sizes that allow passage of connectors 103 and 104 are provided at positions of first substrate part 501 that correspond to each of connectors 103 and 104 of first flexible substrate 102.

First flexible substrate 102 is stacked with and bonded to second flexible substrate 500 such that connectors 103 and 104 pass through connector passage holes 505 and 506 of second flexible substrate 500. In this state, second flexible substrate 500 is folded at folding portion 503, and second substrate part 502 is caused to adhere so as to be in close contact with the rear surface of first flexible substrate 102.

Figure 8:
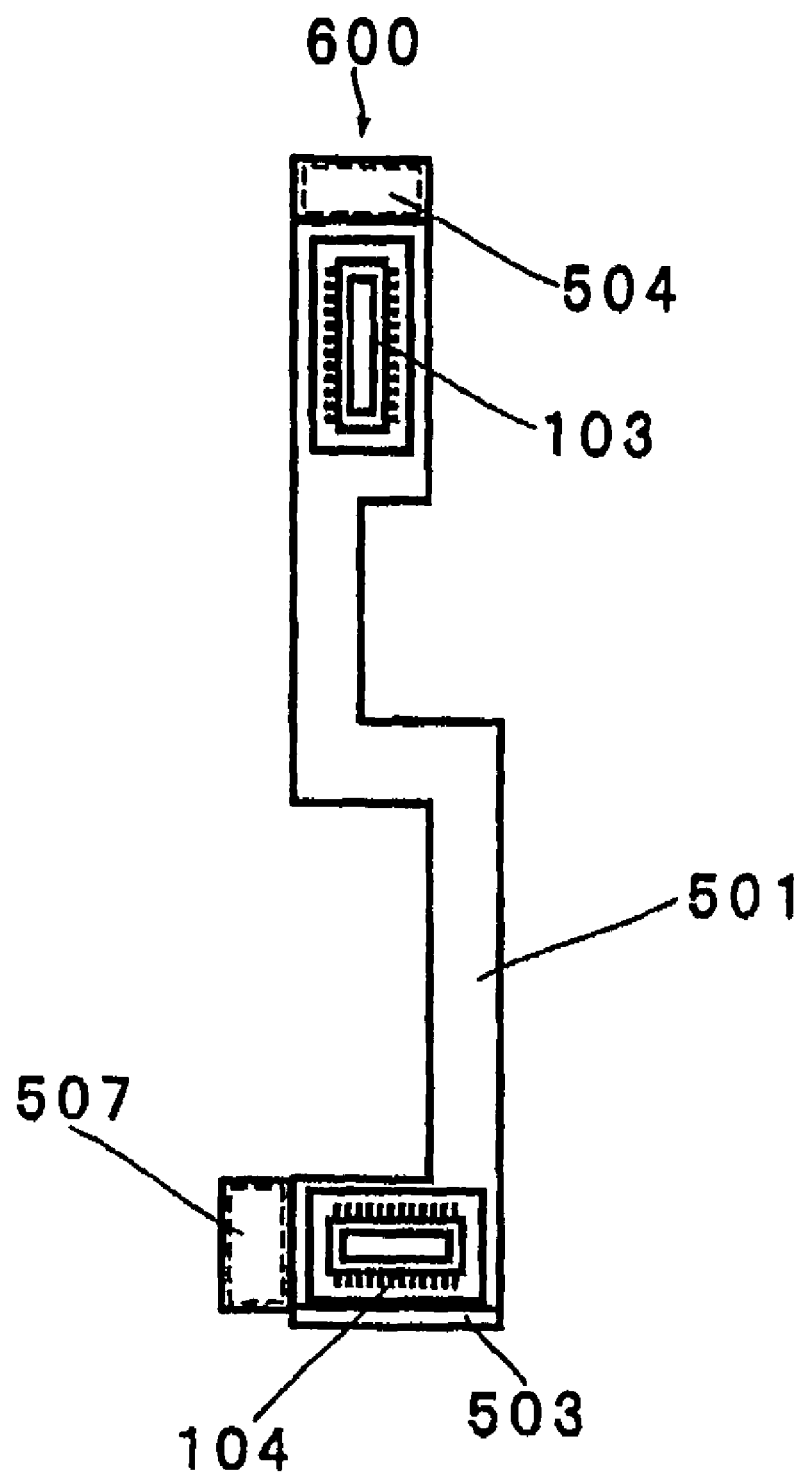
FIG. 8 is a plan view of a flexible connection substrate that employs the second flexible substrate that is shown in FIG. 7.

As shown in FIG. 8, flexible connection substrate 600 is thus obtained having a construction in which the two surfaces of first flexible substrate 102 are thus enclosed by second flexible substrate 500, and first flexible substrate 102 is thus entirely enclosed within the GND of second flexible substrate 500. After the ground region is shielded as in the previously described embodiment, GND pads are prepared and grounding realized at the upper circuit substrate and lower circuit substrate by using soldering or ACF connection. In this way, flexible connection substrate 600 can have the shield effect of first flexible substrate 102 and at the same time realize GND connection of the upper and lower circuit substrates.

Figure 9:
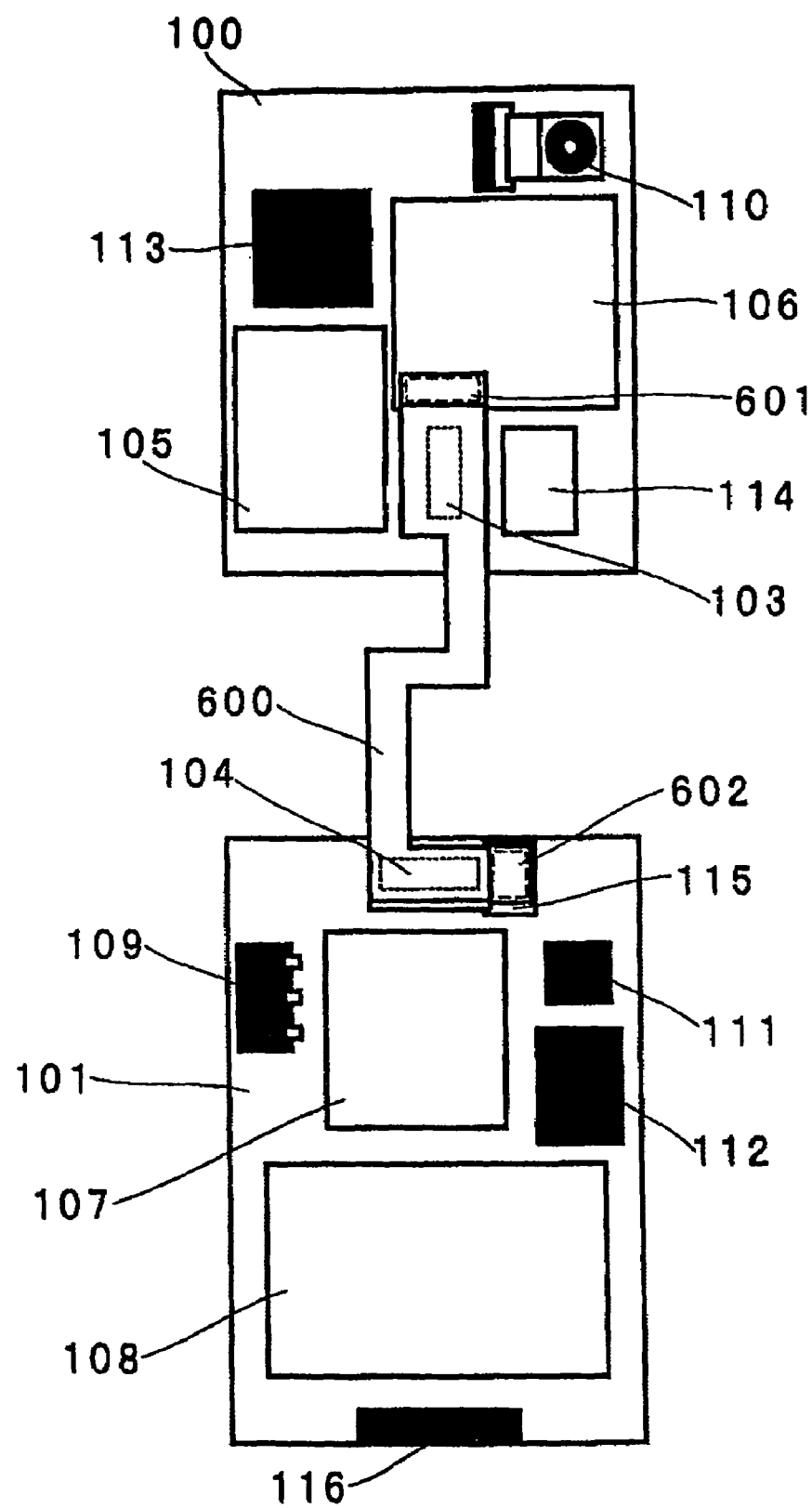
FIG. 9 shows the flexible connection substrate that is shown in FIG. 8 together with the first circuit substrate and second circuit substrate of a folding portable telephone.

FIG. 9 shows the state when flexible connection substrate 600 is connected to upper circuit substrate 100 and lower circuit substrate 101 of a folding portable telephone. In FIG. 9, the grounding region 601 indicates the point of bonding by conductive tape with metal shield 106 on upper circuit substrate 100 at coverlay opening 504 that is provided in one end part of flexible connection substrate 600 that was shown in FIG. 8. Grounding region 602 indicates the point of bonding by conductive tape with GND pad 115 on lower circuit substrate 101 at coverlay opening 507 that is provided at the other end part of flexible connection substrate 600.

The foregoing explanation regarded the application of the present invention to a folding portable telephone. However, the present invention is not limited to the above-described embodiments and can be applied to various electronic apparatuses, such as notebook personal computers, that have a folding construction in which two cases are linked by a hinge and in which each case has a circuit substrate.

Although certain preferred embodiments of the present invention have been shown and described in detail, it should be understood that various changes and modifications may be made without departing from the spirit or scope of the appended claims.

What is claimed is:

1. A flexible connection substrate for a folding electronic apparatus that includes: a first case for accommodating a first circuit substrate in its interior; a second case for accommodating a second circuit substrate in its interior; and a hinge for realizing freely rotatable linking of said first case and said second case; said flexible connection substrate electrically connecting said first circuit substrate and said second circuit substrate through the interior of said hinge; and said flexible connection substrate comprising:
   a first flexible substrate for electrically connecting first signal lines that are formed on said first circuit substrate to second signal lines that are formed on said second circuit substrate; and
   a second flexible substrate for grounding, that has substantially the same planar shape as said first flexible substrate, that includes a conductive material over its entirety, and that connects to any of a plurality of first grounding points that are formed on said first circuit substrate and to any of a plurality of second grounding points that are formed on said second circuit substrate;
   wherein said first flexible substrate and said second flexible substrate are independent and bonded together on one surface.

2. The flexible connection substrate according to claim 1, wherein:
   said first flexible substrate has on the two ends of its front surface a first connector that is connected to a connector of said first circuit substrate and a second connector that is connected to a connector of said second circuit substrate; and
   the front surface or the rear surface of said second flexible substrate is bonded by conductive tape to the vicinities of the two ends on the rear-surface side of said first flexible substrate.

3. The flexible connection substrate according to claim 1, wherein:
   said first flexible substrate has on the two ends of its front surface a first connector that is connected to a connector of said first circuit substrate and a second connector that is connected to a connector of said second circuit substrate; and
   said second flexible substrate has openings in which said conductive material is exposed that is bonded to said first and second grounding points at positions in the vicinities of said first and second connectors, respectively.

4. The flexible connection substrate according to claim 1, wherein:
   said first flexible substrate has on the two ends of its front surface a first connector that is connected to a connector of said first circuit substrate and a second connector that is connected to a connector of said second circuit substrate; and
   said second flexible substrate has metal terminals that are connected to said conductive material and that are soldered to said first and second grounding points at positions in the vicinities of said first and second connectors, respectively.

5. The flexible connection substrate according to claim 1, wherein:
   said first flexible substrate has on the two ends of its front surface a first connector that is connected to a connector of said first circuit substrate and a second connector that is connected to a connector of said second circuit substrate; and
   said second flexible substrate has openings in which said conductive material is exposed that is connected by Anisotropic Conductive Film (ACF) to said first and second grounding points at positions in the vicinities of said first and second connectors, respectively.

6. The flexible connection substrate according to claim 1, wherein:
   said first flexible substrate has on the two ends of its front surface a first connector that is connected to a connector of said first circuit substrate and a second connector that is connected to a connector of said second circuit substrate;
   said second flexible substrate has first and second openings in which said conductive material is exposed at positions in the vicinities of said first and second connectors, respectively; and
   predetermined grounding points of said plurality of first grounding points are connected to said first opening and predetermined grounding points of said plurality of second grounding points are connected to said second opening by clips having conductivity.

7. The flexible connection substrate according to claim 1, wherein:
   said second flexible substrate has a structure in which a conductive layer that uses copper foil as said conductive material and a coverlay are sequentially layered on a base film; and
   openings are provided in said coverlay to expose said conductive layer at points that are to be connected to any of said plurality of first grounding points and points that are to be connected to any of said plurality of second grounding points.

8. A flexible connection substrate of a folding electronic apparatus that includes:
   a first case for accommodating in its interior a first circuit substrate;
   a second case for accommodating in its interior a second circuit substrate; and
   a hinge for freely rotatably linking said first case and said second case;
   said flexible connection substrate electrically connecting said first circuit substrate and said second circuit substrate through the inside of said hinge;
   said flexible connection substrate comprising:
   a first flexible substrate that is provided on the two ends of its front surface with a first connector that is connected to said first circuit substrate and a second connector that is connected to said second circuit substrate; and that electrically connects first signal lines that are formed on said first circuit substrate with second signal lines that are formed on said second circuit substrate; and
   a second flexible substrate that includes a first substrate part that has substantially the same planar shape as said first flexible substrate and contains a conductive material throughout, and a second substrate part that has a planar shape that has line symmetry with said first substrate part with the folding portion as the axis of symmetry with respect to said first substrate part, and moreover that contains a conductive material throughout; whereby folding at said folding portion causes said first substrate part to confront said second substrate part;

wherein: said first substrate part of said second flexible substrate has: a first connection part that is connected to any of said plurality of first grounding points that is formed on said first circuit substrate; a second connection part that is connected to any of said plurality of second grounding points that is formed on said second circuit substrate; a first connector passage hole of a size that allows passage of said first connector, and a second connector passage hole of a size that allows passage of said second connector; and after folding at said folding portion such that said first substrate part and said second substrate part confront each other and said first and second connectors have passed through said first and second connector passage holes, respectively, said first flexible substrate is interposed between said first substrate part and said second substrate part.

9. The flexible connection substrate according to claim 8, wherein said first and second substrate parts of said second flexible substrate have a construction in which a conductive layer that uses copper foil as said conductive material and a coverlay are successively layered on a base film; and openings are provided in said coverlay at said first connection part and said second connection part such that said conductive layer is exposed.

10. A folding electronic apparatus comprising:
a first case for accommodating in its interior a first circuit substrate;
a second case for accommodating in its interior a second circuit substrate;
a hinge for freely rotatably linking said first case and said second case;
a flexible connection substrate for electrically connecting said first circuit substrate and said second circuit substrate through the interior of said hinge;
wherein said flexible connection substrate includes:
a first flexible substrate for electrically connecting first signal lines that are formed on said first circuit substrate and second signal lines that are formed on said second circuit substrate; and
a second flexible substrate for grounding, that has substantially the same planar shape as said first flexible substrate; that contains a conductive material throughout; and that connects to any of a plurality of first grounding points that is formed on said first circuit substrate and to any of a plurality of second grounding points that is formed on said second circuit substrate; and wherein said first flexible substrate and said second flexible substrate are bonded together on one surface at a position that is located inside said first case and a position that is located inside said second case.

11. A folding electronic apparatus comprising:
a first case for accommodating in its interior a first circuit substrate; a second case for accommodating in its interior a second circuit substrate;
a hinge for freely rotatably linking said first case and said second case;
a flexible connection substrate for electrically connecting said first circuit substrate and said second circuit substrate through the interior of said hinge;
wherein said flexible connection substrate includes:
a first flexible substrate that is provided on the two ends of its front surface with a first connector that is connected to said first circuit substrate and a second connector that is connected to said second circuit substrate, and that electrically connects first signal lines that are formed on said first circuit substrate and second signal lines that are formed on said second circuit substrate; and
a second flexible substrate that has: a first substrate part that has substantially the same planar shape as said first flexible substrate, and that contains a conductive material throughout; and a second substrate part that has a planar shape that has line symmetry with said first substrate part with the folding portion as the axis of symmetry with respect to the first substrate part; wherein folding at said folding portion causes said first substrate part to confront said second substrate part;
wherein:
said first substrate part of said second flexible substrate includes: a first connection part that is connected to any of a plurality of first grounding points that is formed on said first circuit substrate; a second connection part that is connected to any of a plurality of second grounding parts that is formed on said second circuit substrate; a first connector passage hole of a size that allows passage of said first connector; and a second connector passage hole of a size that allows passage of said second connector; and
after folding at said folding portion such that said first substrate part and said second substrate part confront each other and said first and second connectors have passed through said first and second connector passage holes, respectively, said first flexible substrate is interposed between said first substrate part and said second substrate part.

* * * * *